(12) United States Patent
Yahashi et al.

(10) Patent No.: US 7,387,921 B2
(45) Date of Patent: Jun. 17, 2008

(54) METHOD OF MANUFACTURING SEMICONDUCTOR DEVICE

(75) Inventors: Katsunori Yahashi, Yokohama (JP); Keiichi Takenaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 434 days.

(21) Appl. No.: 11/285,149

(22) Filed: Nov. 23, 2005

(65) Prior Publication Data

US 2006/0138413 A1 Jun. 29, 2006

(30) Foreign Application Priority Data

Nov. 24, 2004 (JP) ............... 2004-338508

(51) Int. Cl.
*H01L 21/00* (2006.01)
*H01L 21/84* (2006.01)
*H01L 21/336* (2006.01)

(52) U.S. Cl. .............. 438/163; 438/151; 438/197; 257/E21.625; 257/E21.626

(58) Field of Classification Search ........... 438/151, 438/163, 197; 257/E21.625, E21.626
See application file for complete search history.

(56) References Cited

U.S. PATENT DOCUMENTS

| | | | |
|---|---|---|---|
| 5,641,698 A | 6/1997 | Lin | |
| 5,989,966 A * | 11/1999 | Huang | .......... 438/305 |
| 6,365,455 B1 | 4/2002 | Su et al. | |
| 6,391,732 B1 | 5/2002 | Gupta et al. | |
| 2003/0098486 A1* | 5/2003 | Sambonsugi et al. | ....... 257/371 |
| 2004/0232494 A1* | 11/2004 | Nagano et al. | ............. 257/382 |

FOREIGN PATENT DOCUMENTS

| | | |
|---|---|---|
| JP | 03-101238 | 4/1991 |
| JP | 2001-15740 | 1/2001 |
| JP | 2005-514766 | 5/2005 |
| WO | WO 03/054952 A1 | 7/2003 |

OTHER PUBLICATIONS

Notification of Reason for Rejection issued by the Japanese Patent Office on Dec. 14, 2007, for Japanese Patent Application No. 2004-338508, and English-language translation thereof.

* cited by examiner

*Primary Examiner*—Scott B. Geyer
*Assistant Examiner*—Seahvosh J Nikmanesh
(74) *Attorney, Agent, or Firm*—Finnegan, Henderson, Farabow, Garrett & Dunner, L.L.P.

(57) ABSTRACT

Disclosed is a method of manufacturing a semiconductor device, comprising forming a gate electrode on a main surface of a semiconductor substrate via a gate insulating film, laminating sequentially a first insulating film with oxidation resistance and a silicon film on the main surface of the semiconductor substrate on which the gate electrode is formed, eliminating selectively the silicon film except for a side face of the gate electrode, and oxidizing the silicon film to transform it into a first silicon oxide film, eliminating the first insulating film on the main surface of the semiconductor substrate by using the first silicon oxide film as a mask, and then forming a first impurity layer on the main surface of the semiconductor substrate, laminating a sidewall insulating film thicker than the first silicon oxide film on the side face of the gate electrode on which the first silicon oxide film is formed, and forming a second impurity layer which has the same conduction type as that of the first impurity layer and has impurity concentration higher than that of the first impurity layer close to the first impurity layer by using the sidewall insulating film as a mask.

20 Claims, 7 Drawing Sheets

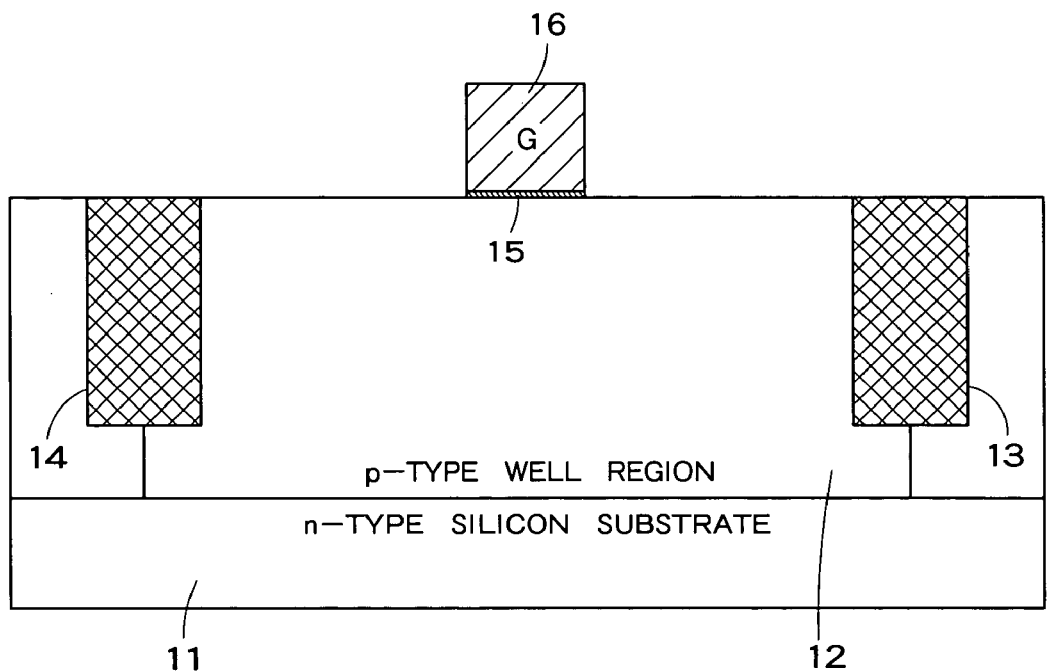
F I G. 2
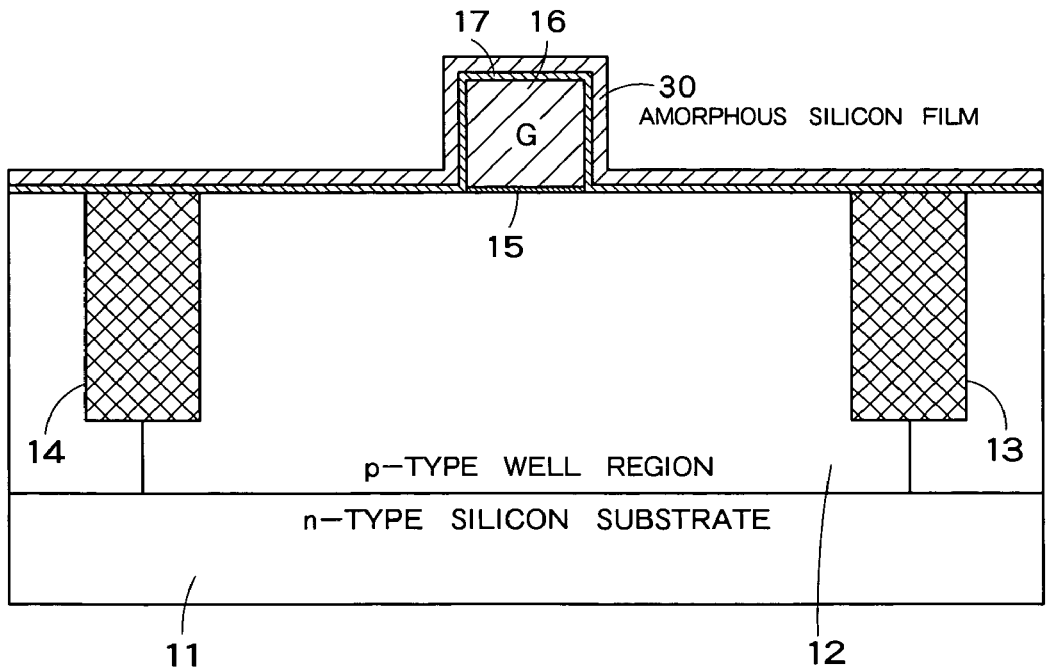
F I G. 3

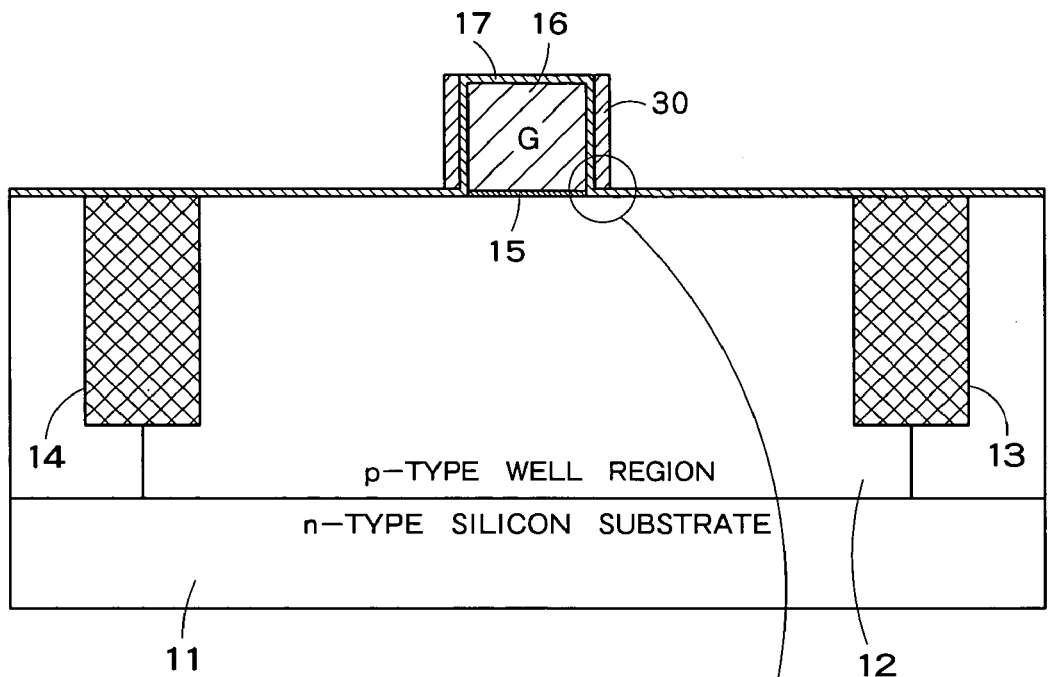
F I G. 4A
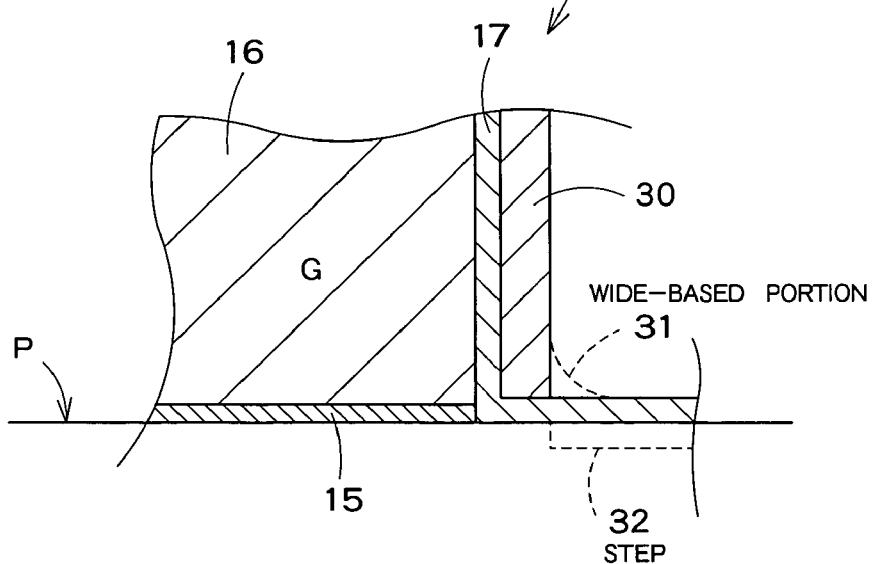
F I G. 4B

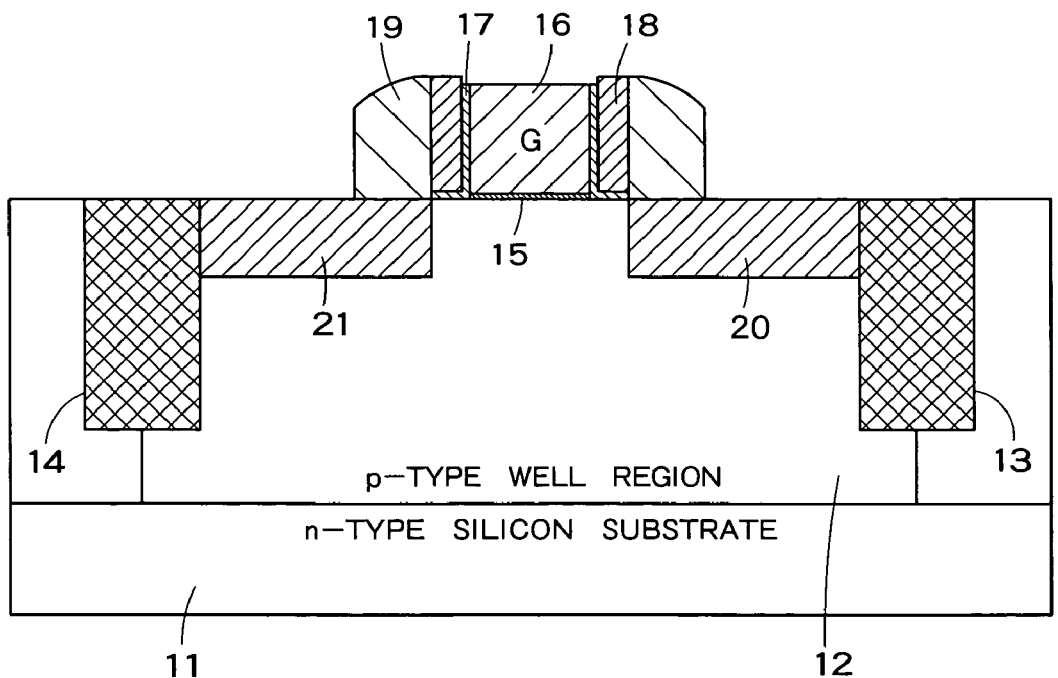
F I G. 7
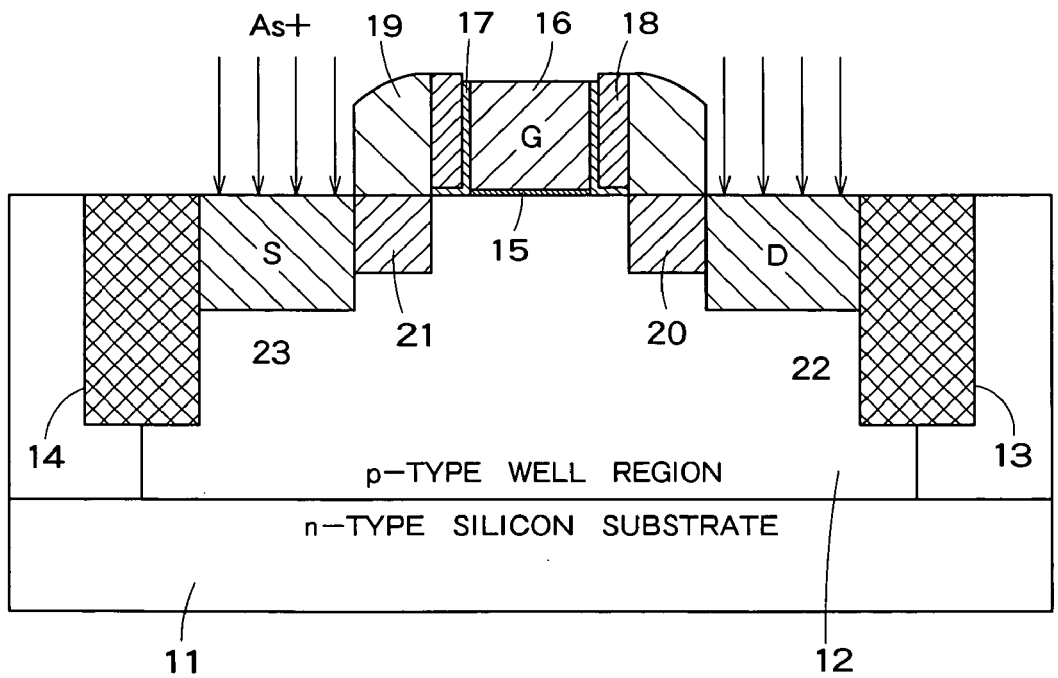
F I G. 8

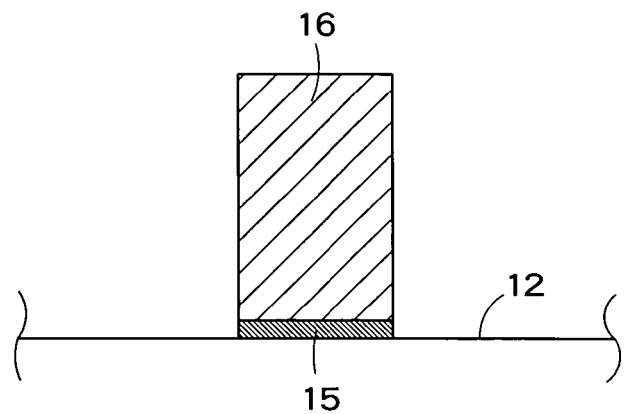
F I G. 9A
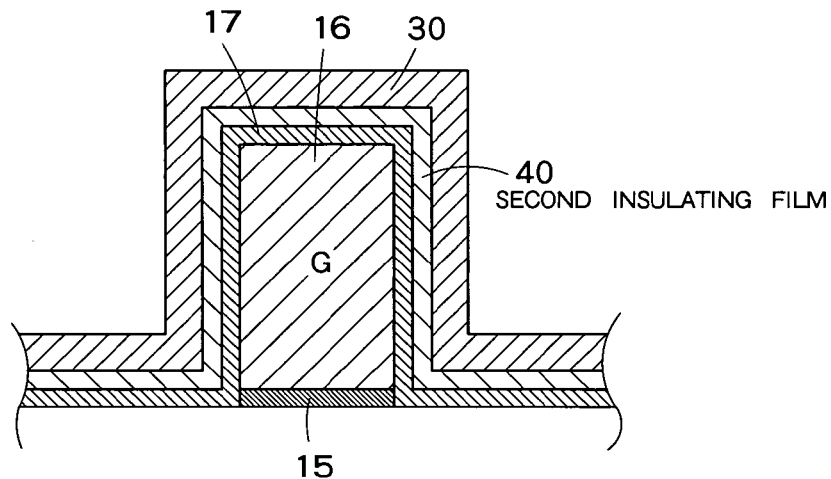
F I G. 9B
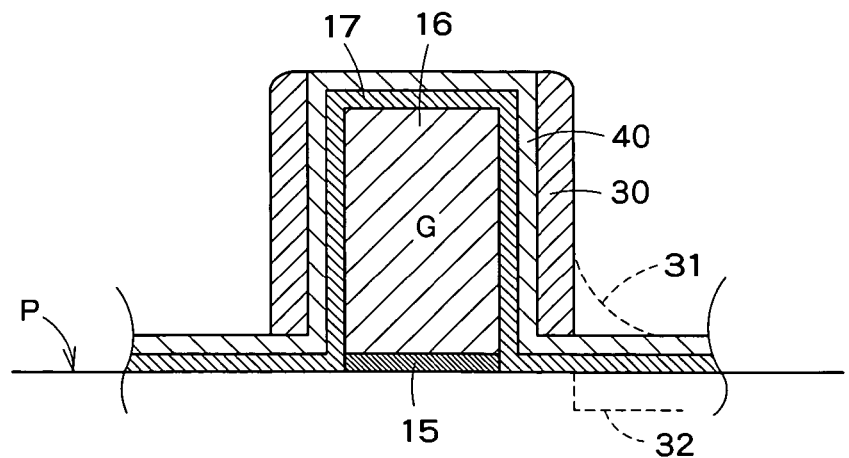
F I G. 9C

METHOD OF MANUFACTURING SEMICONDUCTOR DEVICE

CROSS REFERENCE TO RELATED APPLICATIONS

This application is based upon and claims the benefit of priority from the prior Japanese Patent Application No. 2004-338508, filed on Nov. 24, 2004, the entire contents of which are incorporated herein by reference.

BACKGROUND OF THE INVENTION

1. Field of the Invention

The present invention relates to a method of manufacturing a semiconductor device which can be miniaturized.

2. Related Art

With high integration of semiconductor devices, miniaturization of an insulated gate field effect transistor (hereinafter referred to as MIS transistor) is required to restrain increase of chip size.

There has been proposed a MIS transistor with extension structure which has a low concentration impurity region and a highly doped high concentration impurity region adjacent to the low concentration impurity region so that breakdown or degradation of property does not occur when a high voltage is applied between a source and a drain of the MIS transistor.

Conventionally, the extension structure has been formed by ion implantation of impurities using a gate electrode or a sidewall formed on a side face of the gate electrode as a mask (see, for example; Japanese Patent Laid-Open Publication No. 101238/1991, page 3, FIG. 1).

The above document discloses that a silicon nitride film and a silicon oxide film are sequentially deposited so as to overlap the whole surface of the gate electrode, and then the silicon oxide is remained only on the sidewalls of the gate electrode by performing an anisotropic etching of the silicon oxide film. Since the silicon nitride has a large etching selection ratio to a silicon substrate, the silicon nitride acts as an etch stopper during the anisotropic etching in order to prevent over-etching.

However, in the method of manufacturing the semiconductor device disclosed in the above document, low concentration impurities are introduced using the gate electrode directly as a mask. Because of this, as a gate length of the MIS transistor is shortened with miniaturization of the MIS transistor, diffusion of impurities under the gate electrode cannot be ignored.

Therefore, it is necessary to introduce low concentration impurities by using a sidewall formed on the side face of the gate electrode as the mask. However, in a conventional method of forming the sidewall, there is a problem that, as the thickness of an insulating film on the side face of the gate electrode becomes thinner (i.e. 10 nm or less) with the miniaturized MIS transistor, it is difficult to obtain a desirable sidewall shape.

That is, when the silicon oxide film is formed as a thin insulating film and an anisotropic etching is performed by RIE method, a reaction product obtained by the etching is again deposited on the silicon oxide film according to etching conditions. Therefore, a bottom side of the silicon oxide film at the lower side of the gate electrode spreads. This results in a fluctuation of a film thickness of a final sidewall used as a mask of ion implantation.

Furthermore, as the silicon nitride film becomes thin, the silicon nitride film does not properly function as a stopper of the anisotropic etching. In accordance with conditions for etching the thin insulating film, there may be a problem in that a silicon substrate disposed at bottom side is etched, and a step is formed between the gate electrode and the silicon substrate.

Accordingly, a distance between the gate electrode and a low concentration impurity region or a high concentration impurity region fluctuates, and a desirable extension structure is not obtained, thereby fluctuating properties of the MIS transistor.

SUMMARY OF THE INVENTION

According to one embodiment of the present invention, there is provided a method of manufacturing a semiconductor device, comprising:

forming a gate electrode on a main surface of a semiconductor substrate via a gate insulating film;

laminating sequentially a first insulating film with oxidation resistance and a silicon film on the main surface of the semiconductor substrate on which the gate electrode is formed;

eliminating selectively the silicon film except for a side face of the gate electrode, and oxidizing the silicon film to transform it into a first silicon oxide film;

eliminating the first insulating film on the main surface of the semiconductor substrate by using the first silicon oxide film as a mask, and then forming a first impurity layer on the main surface of the semiconductor substrate;

laminating a sidewall insulating film thicker than the first silicon oxide film on the side face of the gate electrode on which the first silicon oxide film is formed; and forming a second impurity layer which has the same conduction type as that of the first impurity layer and has impurity concentration higher than that of the first impurity layer close to the first impurity layer by using the sidewall insulating film as a mask.

According to another embodiment of the present invention, there is provided a method of manufacturing a semiconductor device, comprising:

forming a gate electrode on a main surface of a semiconductor substrate via a gate insulating film;

laminating sequentially a first insulating film, a second insulating film and a silicon film on a main surface of the semiconductor substrate on which the gate electrode is formed, at least one of the first and second insulating films having oxidation resistance;

eliminating selectively the silicon film except for a side face of the gate electrode, oxidizing the silicon film to transform it into a first silicon oxide film, eliminating the second insulating film and the first insulating film on a main surface of the semiconductor substrate, at least one of the first and second insulating films being eliminated by using the first silicon oxide film as a mask, and then forming a first impurity layer on the main surface of the semiconductor substrate;

laminating a sidewall insulating film thicker than the first silicon oxide film on the side face of the gate electrode on which the first silicon oxide film is formed; and forming a second impurity layer which has the same conduction type as that of the first impurity layer and has impurity concentration higher than that of the first impurity layer close to the first impurity layer by using the sidewall insulating film as a mask.

BRIEF DESCRIPTION OF THE DRAWINGS

FIG. 2 is a sectional view illustrating manufacturing process of the semiconductor device 10 according to this embodiment.

FIG. 3 is a sectional view illustrating manufacturing process following to FIG. 2.

FIGS. 4A-4B are sectional views illustrating manufacturing process following to FIG. 3.

FIG. 7 is a sectional view illustrating manufacturing process following to FIG. 6.

FIG. 8 is a sectional view illustrating manufacturing process following to FIG. 7.

FIGS. 9A-9C are sectional views illustrating manufacturing process according to a second embodiment.

DETAILED DESCRIPTION OF THE INVENTION

Hereinafter, referring to drawings, embodiments according to the present invention will be described below.

First Embodiment

Figure 1A:
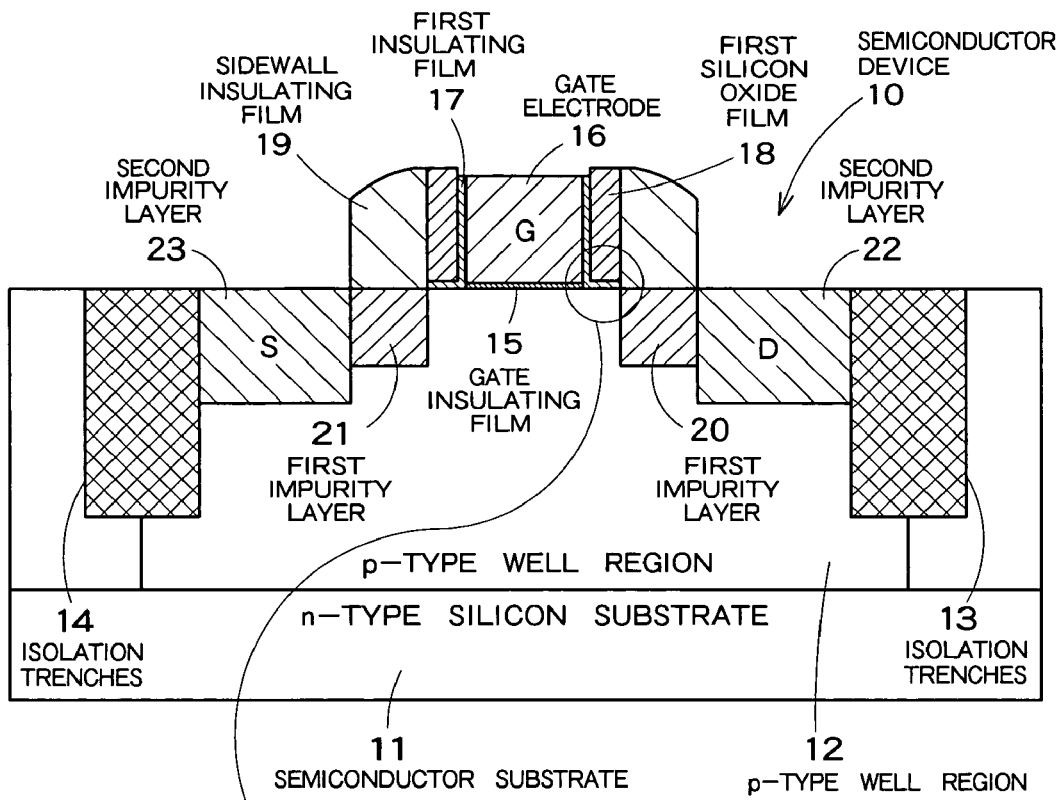
FIG. 1A is a cross sectional view of a semiconductor device according to the first embodiment of the present invention.
Figure 1B:
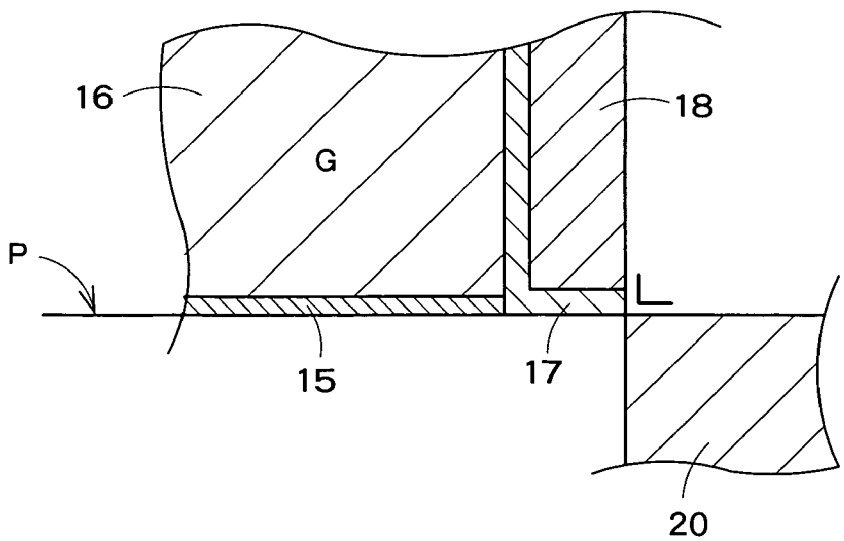
FIG. 1B is an enlarged cross sectional view of the main part of FIG. 1A.

FIG. 1A is a cross sectional view of a semiconductor device according to the first embodiment of the present invention. FIG. 1B is an enlarged cross sectional view of the main part of FIG. 1A. FIGS. 2 to 8 are cross sectional views showing manufacturing processes of the semiconductor device step by step.

In this embodiment, the semiconductor device including a MIS transistor with an extension structure is manufactured, in which a first thin film sidewall formed on a side face of gate electrode is used as a mask to form a low concentration impurity region, and a second thick film sidewall formed in contact to and outside of the first sidewall is used as a mask to form a high concentration impurity region.

As shown in FIG. 1A, the semiconductor device 10 according to this embodiment includes, a semiconductor substrate 11 such as an n-type silicon substrate, a p-type well region 12, isolation trench portions 13, 14 for electrically isolating the p-type well region 12, a gate electrode 16 formed on the p-type well region 12 via a gate insulating film 15, and first insulating films 17, first silicon oxide 18, and sidewall insulating films 19, which are sequentially laminated on the side faces of the gate electrode 16.

N-type first impurity layers 20, 21 are formed in the p-type well region 12 below the sidewall insulating films 19. N-type second impurity layers 22, 23 having higher impurity concentrations than those of the first impurity layers 20, 21 are formed in contact to and outside of the first impurity layers 20, 21.

The first impurity layers 20, 21 are low concentration impurity regions, and act as an electric field relaxation layer for relaxing an electric field at an interface of a p-n junction formed between the second impurity layers 22, 23 and the p-type well region 12. The second impurity layers 22, 23 are high concentration impurity regions, and act as a source and a drain.

As shown in FIG. 1B, the first insulating film 17 is formed of silicon nitride having a thickness of, for example, substantially 2 nm, and the thickness of the first silicon oxide 18 is, for example, 8 nm. The surface of the sidewall of the first silicon oxide 18 is formed substantially vertical to a plane P that is the surface of the p-type well region 12 without accompanying a wide base, and has a substantially constant thickness. Therefore, the distance between the lower edge of the gate insulating film 15 and the side edges of the gate electrode of the first impurity layers 20, 21 are substantially constant.

Moreover, the lower surface of the gate insulating film 15 are substantially flush with the surfaces of the first impurity layers 20, 21, and the lower surface of the gate insulating film 15 and the surfaces of the first impurity layers 20, 21 are formed on the same plane P as the surface of p-type well region 12.

Therefore, a MIS transistor having a desirable extension structure, in which distances between the gate insulating film 15 and the first impurity layers 20, 21 are controlled substantially to be constant in both horizontal and vertical directions, can be obtained.

FIGS. 2 to 8 are sectional views illustrating manufacturing processes of the semiconductor device 10 according to this embodiment. Now, using these figures, the manufacturing processes of this embodiment will be described below step by step. First, as shown in FIG. 2, an insulator is buried into trenches formed in the p-type well region 12 to form isolation trench portions 13, 14. Such a semiconductor substrate may be prepared previously. Next, the gate insulating film 15 and the gate electrode 16 are formed on the p-type well region 12 that is electrically isolated by the isolation trench portions 13, 14.

The gate electrode 16 and the gate insulating film 15 are formed by, for example, the following steps. Silicon oxide having thickness of substantially 1.5 nm is formed by thermal oxidation, and a poly-silicon film having thickness of substantially 150 nm is formed by CVD (Chemical Vapor Deposition). Next, an opening pattern is formed in a resist by photolithographic technique, and the poly-silicon film is etched by using the silicon oxide film as a stopper by an anisotropic etching such as RIE (Reactive Ion Etching) to form a gate electrode 16 having gate length of substantially 50 nm. Next, using the gate electrode 16 as the mask, the silicon oxide film is wet-etched to form the gate insulating film 15.

When wet etching is performed to form the gate insulating film 15, a portion of the surface of the semiconductor device may be eliminated. Therefore, strictly speaking, after the processing step in FIG. 2 is finished, a step less than 5 nm may be formed between the lower surface of the gate insulating film 15 and the surface of the substrate adjacent to the gate insulating film 15.

Next, as shown in FIG. 3, the first insulating film 17 and a silicon film such as an amorphous silicon film 30 are sequentially formed on the entire surface of the semiconductor substrate 11 including the gate electrode 16. The first insulating film 17 is a silicon nitride film having a thickness of substantially 2 nm, which is formed by, for example, plasma CVD. The amorphous silicon film 30 is formed by, for example, CVD, and has a thickness of substantially 4 nm.

Next, as shown in FIG. 4, using the first insulating film 17 as the stopper, the amorphous silicon film 30 is etched by RIE except the side faces of the gate electrode 16. An etchant which has etching rate decreasing in the following order, i.e. silicon>>silicon nitride>>silicon oxide, is used to etch the amorphous silicon film 30. The etchant has significantly larger etching rate to the amorphous silicon film 30 than the etching rate to the silicon nitride or the like. Furthermore, the thickness of the amorphous silicon film 30 is only substantially 4 nm. Therefore, it is possible to perform the etching processing in short time by controlling the etching condition. Due to the excellent etching selectivity, there is no likelihood that the first insulating film 17 or the p-type well region 12 at the bottom surface side of the amorphous silicon film 30 may be eliminated.

Therefore, there is no likelihood that a wide-based portion 31 formed of a redeposited reaction product composed of silicon oxide or silicon nitride is formed near the contact region between the amorphous silicon film 30 on the lower side of the gate electrode 16 and the first insulating film 17. The surface of the lower sidewall of the amorphous silicon film 30 is formed in a shape substantially vertical to the plane P corresponding to the surface of the p-type well region 12.

As mentioned above, since the etchant for etching the amorphous silicon film 30 can have high etching selection ratio to the silicon nitride film, even if the thickness of the silicon nitride corresponding to the first insulating film 17 is as thin as 2 nm, there is no likelihood that the underlying p-type well region 12 is eliminated, thereby preventing occurrence of the step 32.

As mentioned above, when forming the gate electrode 16 in FIG. 2, if the surface of the semiconductor substrate is eliminated a little bit to form a step, the step still remains after the processes in FIG. 4. Thereby, strictly speaking, there is a possibility that the step 32 less than 5 nm is formed.

Figure 5:
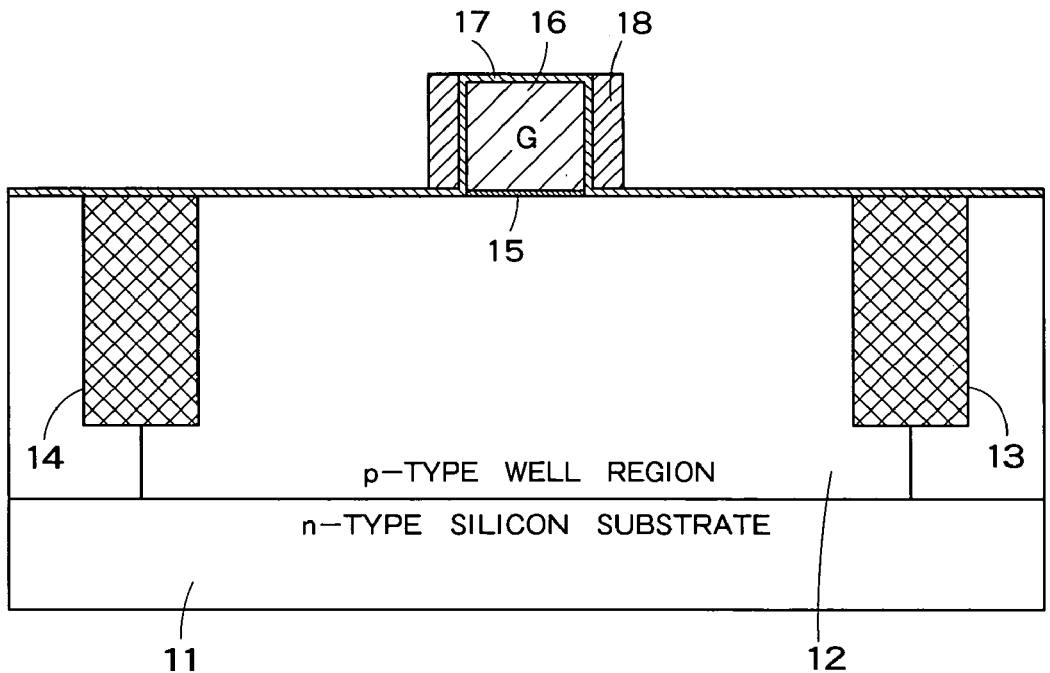
FIG. 5 is a sectional view illustrating manufacturing process following to FIG. 4.

Next, as shown in FIG. 5, the amorphous silicon film 30 is thermally oxidized, for example, in an oxygen atmosphere at 850° C. to 1100° C., using the first insulating film 17 as the stopper.

By the thermal oxidation, the volume of the amorphous silicon film 30 is expanded while holding the vertical shape of the surface of the lower sidewall. The amorphous silicon film 30 is changed into the first silicon oxide 18 having thickness of substantially 8 nm. When performing the thermal oxidation, the surface of the p-type well region 12 is covered with the first insulating film 17, and silicon nitride as a material forming the first insulating film 17 has an excellent oxidation resistance. Therefore, even if the thermal oxidation of the amorphous silicon film 30 is performed, there is no likelihood that the surface of the p-type well region 12 is oxidized. That is, the first insulating film 17 also acts as a barrier layer for protecting the surface of the p-type well region 12 from being oxidized.

Next, the first insulating film 17 is etched with, for example, hot phosphoric acid, to form first sidewalls on the side faces of the gate electrode 16. The first sidewall is composed of a laminate of the first insulating film 17 and the first silicon oxide 18 on the side face of the gate electrode 16. The bottom surface of the first sidewall is flush with the surface P of the p-type well region 12, and has a thickness of substantially 10 nm.

During forming the first sidewall, it is required to etch the amorphous silicon film 30. At that time, there is a possibility that the upper side of the first sidewall is etched a little bit more than the lower side, and the angle between the surface of the first sidewall and the plane P is 90° to 95°.

Figure 6:
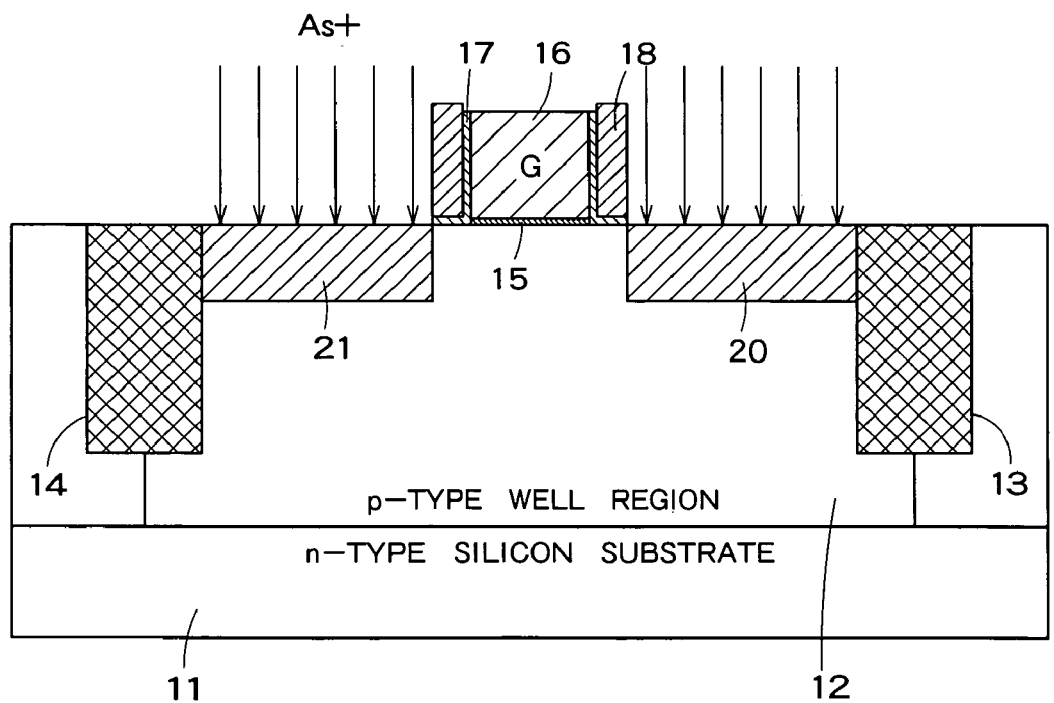
FIG. 6 is a sectional view illustrating manufacturing process following to FIG. 5.

Next, as shown in FIG. 6, the n-type first impurity layers 20, 21 corresponding to the electric field relaxation layer of the p-n junction are formed by implanting, for example, arsenic (As) ions vertically to the semiconductor substrate 11, at an acceleration voltage of 10 keV and at dose amount of substantially $10^{13}$ atoms/cm$^3$, using the gate electrode 16 and the first sidewall as the masks.

Next, as shown in FIG. 7, an insulating film is formed on the entire surface of the semiconductor substrate 11 including the gate electrode 16 by use of, for example, plasma CVD. The insulating film formed here is the silicon nitride film or the silicon oxide film having a thickness of substantially 50 nm formed by, for example, CVD.

Next, the insulating film is selectively removed except the sides of the gate electrode 16 by an anisotropic etching such as RIE. The etchant used here has a characteristic that etching rate to the silicon oxide film or the silicon nitride film as the material of the insulating film is significantly larger than etching rate to silicon. Therefore, there is no likelihood that the p-type well region 12 is etched, and the insulating film is formed on only the sides of the gate electrode 16.

By the above manufacturing steps, a second sidewall obtained by laminating the first insulating film 17, the first silicon oxide film 18 and the sidewall insulating film 19 is formed in each side face of the gate electrode 16 Next, as shown in FIG. 8, the second impurity layers 22, 23 to be a source S and a drain D are formed by implanting, for example, arsenic (As) ions vertically to the semiconductor substrate 11, at an acceleration voltage of 20 keV and at dose amount of substantially $10^{15}$ atoms/cm$^3$, using the gate electrode 16 and the first sidewall as the masks.

This result in completion of the semiconductor device 10 in which the bottom surface of the gate insulating film 15 and the surfaces of the first impurity layers 20, 21 shown in FIG. 1 are substantially flush with the same plane P, and the surface of the sidewall of the first silicon oxide 18 on the lower side of the gate electrode 16 is substantially vertical to the plane P.

As described above, according to the manufacturing method of the semiconductor device according to this embodiment, the amorphous silicon film 30 except the side faces of the gate electrode 16 is etched and removed after the first insulating film 17 and the amorphous silicon film 30 are sequentially formed on the surface of the semiconductor substrate on which the gate electrode 16 is formed. Because of this, the first insulating film 17 acts as the etch stopper, and there is no possibility that the surface of the semiconductor substrate is eliminated. Moreover, since the first insulating film 17 has a greatly different etching selection ratio as compared to that of the amorphous silicon film 30, the amorphous silicon film 30 can be formed in a shape substantially vertical to the substrate surface. Therefore, even if the reactive product is redeposited on the surface of the amorphous silicon film 30, it is possible to eliminate the redeposited reactive product by over-etching without eliminating the surface of the semiconductor substrate. Furthermore, after then, the amorphous silicon film 30 is thermally oxidized to form the first silicon oxide 18. However, since the surface of the semiconductor substrate is covered with the first insulating film 17, there is no possibility that the surface of the semiconductor substrate is oxidized. This results in a first sidewall which has no step between itself and the p-type well region 12, and which is substantially vertical to the substrate surface.

The distances between the gate electrode 16 and the first impurity layers 20, 21 also become substantially constant, and a MIS transistor with extension structure having a desired size can be formed stably. Therefore, miniaturization is also easily achieved, and a highly integrated semiconductor device with a small chip size can be obtained.

Here, although an example in which the silicon film is the amorphous silicon film 30 has been described above, a polysilicon film may be used instead of the amorphous silicon film.

Second Embodiment

A second embodiment is characterized in that a structure of the first sidewall is different from that of the first embodiment.

Although the first sidewall according to the first embodiment is formed by using a laminated film having the first insulating film 17 and the first silicon oxide 18, the first sidewall according to this embodiment has a second insulation layer formed between the first insulating film 17 and the first silicon oxide 18.

FIGS. 9A to 9C and FIGS. 10A to 10C are cross sectional views showing manufacturing processes according to the second embodiment, and only the structure surrounding the gate electrode is shown in these figures. In these figures, the same reference numeral is given to the same component as the above first embodiment, and the difference points will be mainly described below.

First, as shown in FIG. 9A, a gate electrode 16 is formed on the surface of the p-type well region 12 via a gate insulating film 15. Next, as shown in FIG. 9B, a first insulating film 17, a second insulating film 40 composed of silicon oxide of substantially 2 nm thickness by, for example, CVD, and a silicon film 30 are sequentially laminated on the entire surface of the semiconductor substrate 11 including the gate electrode 16. The film structures and film depositing conditions of the first insulating film 17 and the silicon film 30 are the same as those of the first embodiment, the first insulating film 17 is formed of, for example, a silicon nitride film having a thickness of substantially 2 nm, and the silicon film 30 is formed of, for example, an amorphous silicon film having a thickness of substantially 4 nm.

Next, as shown in FIG. 9C, the amorphous silicon film 30 is etched by RIE except a side face of the gate electrode 16. Since the etching rate of the etchant used here decreases in the following order: silicon>>silicon nitride>>silicon oxide. Therefore, there is no possibility that the second insulating film 40 is etched. Even if the reactive product made of the silicon nitride film and the silicon oxide film is redeposited on the amorphous silicon film 30 at the lower side of the gate electrode 16 and the second insulating film 40 connected to the gate electrode 16, it is possible to easily reduce the redeposited reactive product by over-etching.

Accordingly, the amorphous silicon film 30 does not have wide-based portion 31 obtained by redepositing the reactive product on the amorphous silicon film 30 at the lower side of the gate electrode. It is possible to obtain the amorphous silicon film 30 in a shape nearly vertical to the plain P corresponding to the surface of the p-type well region 12.

Figure 10A:
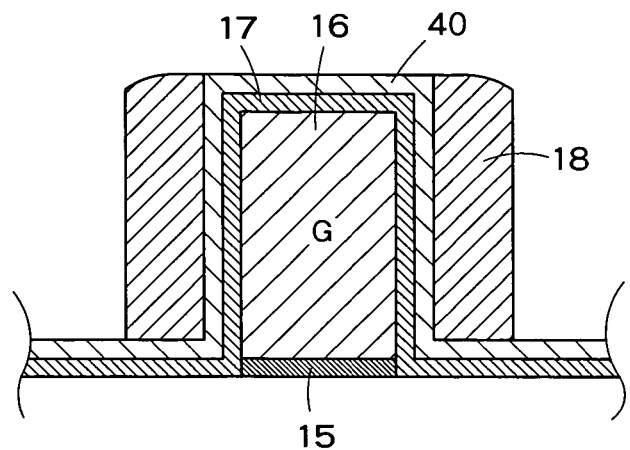
FIGS. 10A-10C are sectional views illustrating manufacturing process following to FIG. 9.

Next, as shown in FIG. 10A, the amorphous silicon film 30 is transformed into a first silicon oxide 18 by thermal oxidation.

Figure 10B:
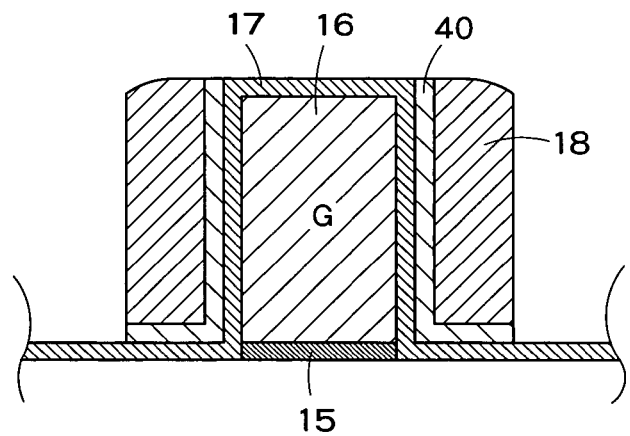

Next, as shown in FIG. 10B, using the first silicon oxide 18 as the mask, the second insulating film 40 is etched by a hydrofluoric acid etchant to expose the first insulating film 17.

At this time, although the first silicon oxide 18 is also etched a little bit, the etched amount is little. Therefore, it doesn't affect the shape of the first silicon oxide 18.

Figure 10C:
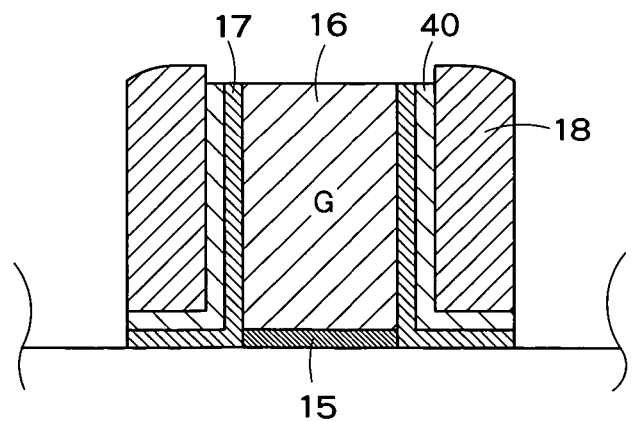

Next, as shown in FIG. 10C, using the first silicon oxide 18 as the mask, the first insulating film 17 is etched by hot phosphoric. Next, after performing the processes shown in FIG. 6 to FIG. 8, a semiconductor device according to the second embodiment is completed.

As described above, according to the method of manufacturing the semiconductor device according to this embodiment, the second insulating film 40 made of silicon oxide is formed between the first insulating film 17 and the amorphous silicon film 30. Therefore, the etching selectivity ratio of the RIE process becomes larger, and a sidewall in a nearly vertical shape is obtained.

In the above description, an example in which the first insulating film 17 is formed of silicon nitride, and the second insulating film 40 is formed of silicon oxide has been described. However, the first insulating film 17 may be formed of silicon oxide, and the second insulating film 40 may be formed of silicon nitride. In the etchant used when selectively removing the amorphous silicon film 30, etching rate to silicon is significantly larger than etching rates to silicon oxide and silicon nitride. Therefore, even if the materials of the first insulating film 17 and the second insulating film 40 are interchanged, the amorphous silicon film 30 can be selectively etched, and a sidewall with a nearly vertical shape, which has no re-deposition of reaction products, can be obtained. Silicon oxide has an excellent property as the etch stop layer, and silicon nitride has an excellent property as an anti-oxidization substrate. Therefore, even if any one of the first insulating film 17 and the second insulating film 40 is placed above the other, the semiconductor device having a desirable structure can be obtained.

In the above described second embodiment, an example in which the amorphous silicon 30 is thermally oxidized to transform it into the first silicon oxide film 18, and the second insulating film 40 is etched has been described. Instead of that, using the amorphous silicon film 30 selectively eliminated except for the side face of the gate electrode 16 as a mask, the second insulating film 40 is etched, and then the amorphous silicon film 30 may be thermally oxidized to transform it into the first silicon oxide film 18.

What is claimed is:

1. A method of manufacturing a semiconductor device, comprising:

forming a gate electrode on a main surface of a semiconductor substrate via a gate insulating film;

laminating sequentially a first insulating film with oxidation resistance and a silicon film on the main surface of the semiconductor substrate on which the gate electrode is formed;

eliminating selectively the silicon film except for a side face of the gate electrode, and oxidizing the silicon film to transform it into a first silicon oxide film;

eliminating the first insulating film on the main surface of the semiconductor substrate by using the first silicon oxide film as a mask, and then forming a first impurity layer on the main surface of the semiconductor substrate;

laminating a sidewall insulating film thicker than the first silicon oxide film on the side face of the gate electrode on which the first silicon oxide film is formed; and forming a second impurity layer which has the same conduction type as that of the first impurity layer and has impurity concentration higher than that of the first impurity layer close to the first impurity layer by using the sidewall insulating film as a mask.

2. A method of manufacturing a semiconductor device according to claim 1,
wherein the silicon film is selectively eliminated by a reactive ion etching.

3. A method of manufacturing a semiconductor device according to claim 2,
wherein the first insulating film is a silicon nitride film; and
when selectively eliminating the silicon film, an etchant in which an etching rate to the silicon film is higher than an etching rate to the silicon nitride film is used.

4. A method of manufacturing a semiconductor device according to claim 1,
wherein a vertical interval between a bottom surface of the gate insulating film and the main surface of the semiconductor substrate located at both sides of the gate electrode obtained after selectively eliminating the silicon film is less than 5 nm.

5. A method of manufacturing a semiconductor device according to claim 1,
wherein an angle between a surface of the first silicon oxide film obtained by oxidizing the silicon film and the main surface of the semiconductor substrate is 90° to 95°.

6. A method of manufacturing a semiconductor device according to claim 1,
wherein a thickness of the first insulating film is thinner than that of the silicon film.

7. A method of manufacturing a semiconductor device according to claim 1,
wherein a distance between an end portion in the gate electrode side of the first impurity layer formed at one side of the gate electrode and a lower end portion of the gate insulating film on the side is equal to a distance between an end portion in the gate electrode side of the first impurity layer formed at the other side of the gate electrode and a lower end portion of the gate insulating film on the other side.

8. A method of manufacturing a semiconductor device according to claim 1,
wherein the silicon film is an amorphous silicon film or a polysilicon film; and
the first silicon oxide film is formed by thermally oxidizing the silicon film on the side face of the gate electrode.

9. A method of manufacturing a semiconductor device according to claim 1,
wherein the first impurity layer is an electric field relaxation layer which relaxes an electric field of p-n junction formed between the semiconductor substrate and the second impurity layer; and
the second impurity layer is a source region or a drain region.

10. A method of manufacturing a semiconductor device, comprising:
forming a gate electrode on a main surface of a semiconductor substrate via a gate insulating film;
laminating sequentially a first insulating film, a second insulating film and a silicon film on a main surface of the semiconductor substrate on which the gate electrode is formed, at least one of the first and second insulating films having oxidation resistance;
eliminating selectively the silicon film except for a side face of the gate electrode, oxidizing the silicon film to transform it into a first silicon oxide film, eliminating the second insulating film and the first insulating film on a main surface of the semiconductor substrate, at least one of the first and second insulating films being eliminated by using the first silicon oxide film as a mask, and then forming a first impurity layer on the main surface of the semiconductor substrate;
laminating a sidewall insulating film thicker than the first silicon oxide film on the side face of the gate electrode on which the first silicon oxide film is formed; and
forming a second impurity layer which has the same conduction type as that of the first impurity layer and has impurity concentration higher than that of the first impurity layer close to the first impurity layer by using the sidewall insulating film as a mask.

11. A method of manufacturing a semiconductor device according to claim 10,
wherein the second insulating film and the first insulating film on the main surface of the semiconductor substrate are sequentially eliminated by using the first silicon oxide film as a mask after the silicon film on the side face of the gate electrode is oxidized to transform it into the first silicon oxide film.

12. A method of manufacturing a semiconductor device according to claim 10,
wherein the second insulating film on the main surface of the semiconductor substrate is eliminated by using the silicon film on the side face of the gate electrode as a mask, and then the silicon film is oxidized to transform it into the first silicon oxide film, and the first insulating film on the main surface of the semiconductor substrate is eliminated by using the first silicon oxide film as a mask, the first insulating film having oxidation resistance.

13. A method of manufacturing a semiconductor device according to claim 10,
wherein the silicon film is selectively eliminated by a reactive ion etching.

14. A method of manufacturing a semiconductor device according to claim 13,
wherein one of the first insulating film and the second insulating film is a silicon oxide film and the other is a silicon nitride film; and
when selectively eliminating the silicon film, an etchant in which an etching rate to the silicon film is higher than an etching rate to the silicon nitride film and the silicon oxide film is used.

15. A method of manufacturing a semiconductor device according to claim 10,
wherein a vertical interval between a bottom surface of the gate insulating film and the main surface of the semiconductor substrate located at both sides of the gate electrode obtained after selectively eliminating the silicon film is less than 5 nm.

16. A method of manufacturing a semiconductor device according to claim 10,
wherein an angle between a surface of the first silicon oxide film obtained by oxidizing the silicon film and the main surface of the semiconductor substrate is 90° to 95°.

17. A method of manufacturing a semiconductor device according to claim 10,
wherein a thickness of each of the first insulating film and the second isolating film is thinner than that of the silicon film.

18. A method of manufacturing a semiconductor device according to claim 10, wherein a distance between an end portion in the gate electrode side of the first impurity layer formed at one side of the gate electrode and a lower end portion of the gate insulating film on the side is equal to a distance between an end portion in the gate electrode side of the first impurity layer formed at the other side of the gate electrode and a lower end portion of the gate insulating film on the other side.

19. A method of manufacturing a semiconductor device according to claim 10, wherein the silicon film is an amorphous silicon film or a polysilicon film; and the first silicon oxide film is formed by thermally oxidizing the silicon film on the side face of the gate electrode.

20. A method of manufacturing a semiconductor device according to claim 10, wherein the first impurity layer is an electric field relaxation layer which relaxes an electric field of p-n junction formed between the semiconductor substrate and the second impurity layer; and the second impurity layer is a source region or a drain region.

* * * * *